United States Patent [19]

Lipcon

[11] B 3,982,241
[45] Sept. 21, 1976

[54] SELF-ZEROING ANALOG-TO-DIGITAL CONVERSION SYSTEM

[75] Inventor: Jesse B. Lipcon, Brighton, Mass.

[73] Assignee: Digital Equipment Corporation, Maynard, Mass.

[22] Filed: Aug. 19, 1974

[21] Appl. No.: 498,500

[44] Published under the second Trial Voluntary Protest Program on January 20, 1976 as document No. B 498,500.

[52] U.S. Cl. .................. 340/347 CC; 340/347 SH; 340/347 AD; 328/151
[51] Int. Cl.² ........................................ H03K 13/02
[58] Field of Search............... 340/347 AD, 347 CC, 340/347 SH; 328/151, 128, 127, 165

[56] References Cited
UNITED STATES PATENTS

| | | | |
|---|---|---|---|
| 3,516,002 | 6/1970 | Hillis | 340/347 SH |
| 3,653,037 | 3/1972 | Utley | 340/347 AD |
| 3,706,986 | 12/1972 | Petit | 340/347 AD |
| 3,736,586 | 5/1973 | Donjon | 340/347 SH |

*Primary Examiner*—Charles D. Miller
*Attorney, Agent, or Firm*—John M. Gunther; Thomas C. Siekman

[57] ABSTRACT

A self-zeroing, drift-free analog-to-digital conversion system is disclosed in which a single amplifier is shared between an analog-to-digital converter circuit and a sample-and-hold circuit. The offset errors generated by the sample-and-hold circuit cancel with the offset errors generated by the analog-to-digital converter circuit since the circuitry introducing the offset errors is shared. As a result, system offset errors are negated and the system enables changing from a unipolar to bipolar input range without inclusion of any additional circuitry. Usage of a gain preamplifier is provided with no corresponding system offset errors being introduced, moreover, usage of a differential-input gain preamplifier is also provided, with the self-zeroing feature resulting in greatly improved common-mode rejection.

30 Claims, 4 Drawing Figures

3,982,241

SELF-ZEROING ANALOG-TO-DIGITAL CONVERSION SYSTEM

BACKGROUND OF THE INVENTION

This invention is concerned with conversion systems and more particularly with analog-to-digital conversion systems which provide a digital output from an analog input.

The general operation of analog-to-digital conversion systems is well-known to those reasonably skilled in the art. For example, in the laboratory environment a series of electrical voltages or currents is generated on an experimental basis, typically by sensing transducers connected to the experiment being performed. The sensed outputs which are usually voltages are then transmitted to a sample-and-hold circuit which continuously tracks the experimental voltage being provided. At a predetermined time, the sample-and-hold circuit is enabled and the experimental voltage from the sample-and-hold circuit is fixed and transferred to an analog-to-digital converter circuit. The analog-to-digital converter circuit includes a digital-to-analog converter which provides a series of selected comparison voltages. When the voltage provided by the digital-to-analog converter is favorably compared to the fixed analog voltage, the process is halted. A digital number corresponding to the selected comparison voltage provided by the digital-to-analog converter is then read out from the control logic to an instrument or computer.

Inherent in the above description is that several comparisons utilizing differential amplifiers and feedback circuits are required. Because of this, offset errors are introduced into the conversion system, these errors being a major problem vis-a-vis accuracy in measuring the analog input. The major source of system offset errors is the combination of internal voltage and current offsets of the input amplifier in the sample-and-hold circuit and the internal voltage and current offsets of the comparator amplifier in the analog-to-digital converter circuit. The major cause of the individual offset voltages and currents would be the mismatch between the base emitter voltages and transistors corresponding to the two separate and distinct inputs provided to each of the amplifiers and between the base currents which bias each of the two transistors.

In the prior art these problems were overcome by utilizing very high precision and expensive amplifiers so as to minimize individual offset errors and consequently system offset errors. Moreover, additional components could be added to adjust out the offset errors, but the problem still remains that the offset errors drift with temperature. As is apparent, the above solutions require more complex circuits as well as greater expense.

It is, therefore, a primary object of this invention to provide an analog-to-digital conversion system which overcomes the above-recited limitation.

It is a further object of this invention to provide an improved analog-to-digital conversion system which not only reduces the number of components incorporated in the system but also utilizes inexpensive circuitry thereby lessening the cost required for an analog-to-digital conversion system.

It is yet a further object of this invention to provide an improved analog-to-digital conversion system which overcomes the errors introduced by the individual components in an analog-to-digital conversion system.

BRIEF DESCRIPTION OF THE DRAWINGS

The foregoing and other objects, features and advantages of the invention will be apparent from the following more particular description of the preferred embodiments of the invention illustrated in the accompanying drawings of which.

DESCRIPTION OF THE PREFERRED EMBODIMENT

To best understand the operation of the apparatus of this invention, the offset error problem involved in the prior art analog-to-digital conversion systems is first described. The design of such prior art circuits varies; however, the problems related to sampling and holding the input voltages from the analog source and then converting them to digital form are similar. The prior art configuration of FIG. 1 will be described and has been chosen because it is somewhat similar to the apparatus of the present invention.

Figure 1:
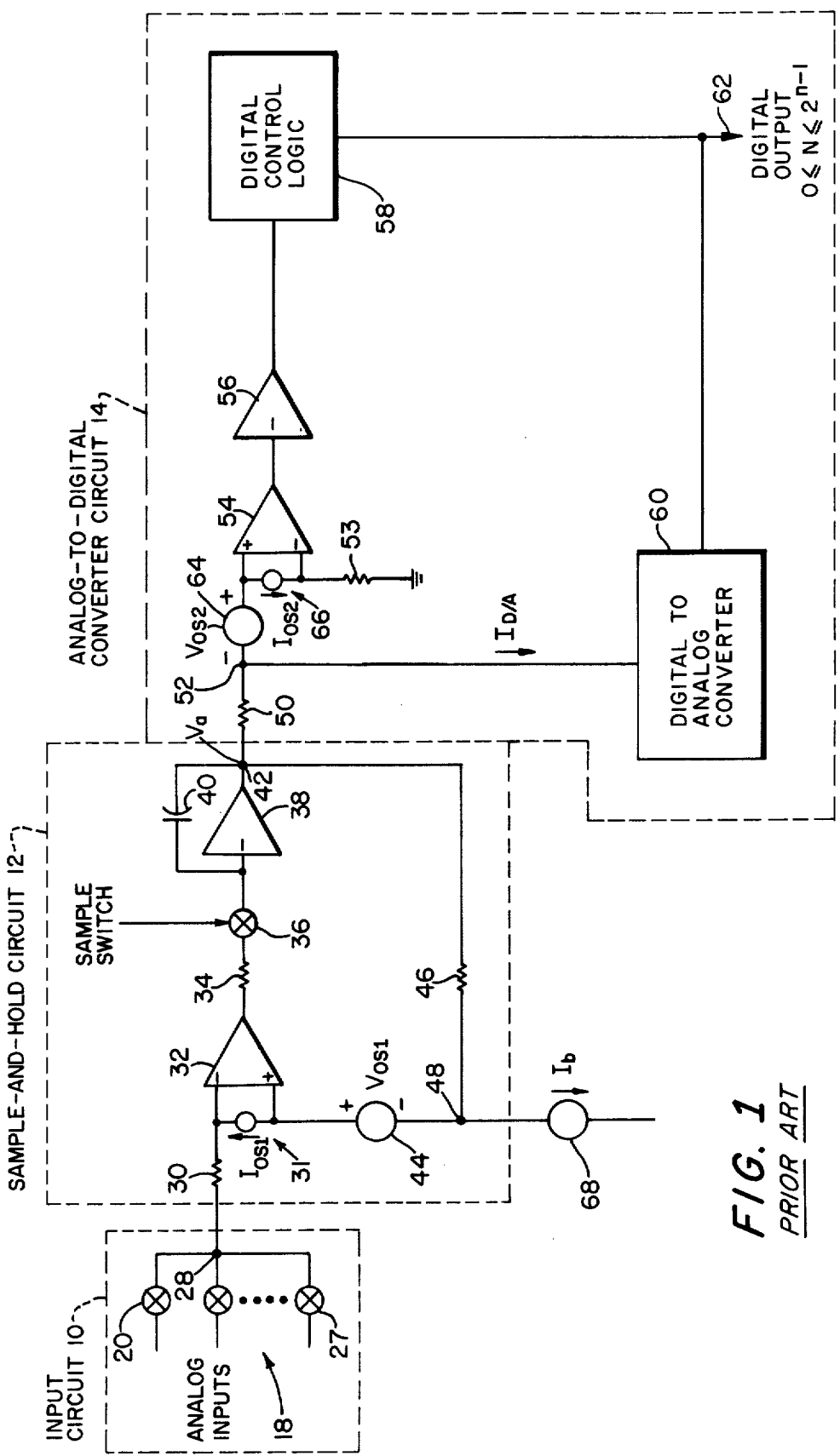
FIG. 1 is a schematic diagram of a prior art analog-to-digital conversion system.

In FIG. 1 there is shown an input circuit 10 for receiving the analog experimental voltage, a sample-and-hold circuit 12 which continuously monitors the input voltage and provides the voltage to an analog-to-digital converter circuit 14 which then compares the held input voltage to a voltage provided by a digital-to-analog converter 60.

More specifically, the input circuit 10 is made up of a plurality of analog inputs which may be from a potentiometer, laboratory instrument (e.g. mass spectrometer), transducers, etc. These devices may be part of an industrial process being executed or part of an experiment wherein relative voltages or currents are being sensed. Connected to the analog inputs is a multichannel multiplexer 18 which has a number of switches 20 to 27 for isolating each of the individual inputs. Eight channels for the multichannel multiplexer have been selected it being recognized that the number of channels can be either greater or less depending upon the situation requirement. By utilizing an eight-channel multiplexer, there can be one experiment with eight outputs or eight separate experiments each having a separate output. One of these signals at a time is then transferred to a node 28 from one of the respective switches 20 to 27.

The selection of the particular channel is made by a computer as is well known in the art. The multiplexer 18 is also well-known in the art and may be an integrated circuit such as the DG501 made by Siliconix or the AM3705 made by National Semiconductor which selects any one of the inputs.

A resistor 30 is connected between node 28 and the inverting input of amplifier 32. Amplifier 32 may be any well-known differential amplifier. As is well known, a differential amplifier is an amplifier having two similar input circuits connected so as to respond to the difference between two voltages or currents and to effectively suppress voltages or currents which are equal from the two input circuits. In the instant situation, differential amplifier 32 compares the input signal which appears at one of the channels of the multiplexer 18 to a signal provided from the feedback loop of sample-and-hold circuit 12. The differential amplifier may be an operational amplifier (voltage in, voltage out) or an operational transconductance amplifier (voltage in, current out) implemented with discrete components, integrated circuits or any other state-of-the-art technique.

The feedback loop for sample-and-hold circuit 12 comprises a resistor 34 connected to the output of differential amplifier 32, a sample switch 36, an amplifier 38 with feedback capacitor 40, and a resistor 46. The switch 36 is in the on state when the sample-and-hold circuit 12 is monitoring the signal from the analog input and is switched to an off state to hold the signal.

The combination of amplifier 38 and capacitor 40 integrates the voltage provided from the amplifier 32. In addition to insuring a stable sample-and-hold feedback loop the circuit 38 and 40 holds the voltage for a fixed period of time since it takes a finite amount of time for the analog-to-digital converter to complete its conversion.

In operation, the voltage $V_a$ at node 42 contains the offset errors caused by differential amplifier 32 of the sample-and-hold circuit. The offset errors include offset voltages and offset currents as well as leakage currents from other sources. The offset voltage is defined as the input voltage into the noninverting input of amplifier 32 which would be necessary to provide exactly a zero voltage output from amplifier 32. The offset current would be similarly described. For a perfect amplifier there would be no need for an additional voltage or current being provided to the noninverting input; however, no perfect amplifier has as yet been developed. Therefore, in order to provide an analytical model, a hypothetical voltage source $V_{os1}$ 44 and current source $I_{os1}$ 31 have been shown which allow amplifier 32 to be described as a perfect amplifier.

The voltage source 44 and current source 31 are equal to the voltage and current which would be required to overcome the inherent errors provided by the components in the sample-and-hold circuit 12 and which would allow the output of sample-and-hold circuit 12 to exactly correspond to the analog input signals.

Analog-to-digital converter circuit 14 includes a resistor 50 coupled between the output of sample-and-hold circuit 12 and the comparator input shown as node 52. The voltage at node 52 is provided to an amplifier 54 which enables digital control logic 58 to set up a comparison signal via a digital-to-analog converter 60. The other input to differential amplifier 54 is provided by resistor 53 coupled to ground.

It is assumed that amplifier 54 is voltage sensitive only and that it has essentially infinite input resistance. It will also be assumed that when the input voltage exceeds zero volts, the output of differential amplifier 54 will be positive, otherwise it will be negative.

It will be recognized to those skilled in the art that the question of whether amplifier 54 is voltage or current sensitive is in a sense a philosophical one. Practical amplifiers include bipolar transistors or field effect transistors or similar devices. The bipolar transistor is a current operative device, but the field effect transistor is voltage sensitive. The bipolar transistor is, in a sense, also voltage sensitive because its collector current will vary with base voltage changes. For both devices, the voltage must be at a certain level for proper operation; and, therefore, the above assumption has been made that the amplifier is only voltage sensitive.

Coupled to the output of amplifier 54 is a buffer amplifier 56 which changes the current output of amplifier 54 into a voltage. If amplifier 54 has a voltage output, then amplifier 56 is not needed. Coupled to the output of amplifier 56 is the digital control logic 58 previously referred to. The combination of the digital control logic 58 and the digital-to-analog converter 60 provides a comparison signal to node 52. The resulting voltage at node 52 is provided to amplifier 54.

The control logic 58 operates such that in response to the input from amplifier 54 through amplifier 56 it adjusts its output to digital-to-analog converter 60 such that the digital-to-analog output is made equal to the sample-and-hold circuit 12 output at 42. For the present implementation the control logic 58 may implement a successive approximation analog-to-digital converter as is exemplary shown in U.S. Pat. No. 3,811,125 issued on May 14, 1974 to a Robert W. Schumann. However, the logic may take other forms such as for example an up/down counter which tracks the input analog signal and the invention is applicable to any analog-to-digital conversion system consisting of a general form of a feedback digital-to-analog converter, comparator and control logic as is shown in FIG. 1.

The digital-to-analog converter 60 is characterized in the preferred embodiment as a digitally controlled current source $I_{d/a}$ which provides a current proportional to a digital value provided from digital control logic 58. The control logic 58 thus changes the $I_{d/a}$ current coming from the digital-to-analog converter 60 such that at node an offsetting voltage is provided which makes the input voltage to comparator 54 zero. The current output from converter 60 is defined by the formula: $I_{d/a} = I_{fs} (N/2^n)$ wherein $0 \leq N \leq (2^n -1)$ for an $n$-bit converter. $N$ represents the digital number corresponding to the current necessary to make the output of amplifier 54 zero, whereas, $n$ represents the number of binary digits (bits) in the digital number. In the instant situation $n$ is equal to 10 and hence $N$ may vary from 0 to 1023.

Also included in the analog-to-digital converter circuit 14 is a voltage source $V_{os2}$ 64 and a current source $I_{os2}$ 66 which are the idealized offset voltage and current needed to represent amplifier 54 as a perfect comparator. The offset error is thus represented as an equivalent voltage source and current source which provides the difference to the true signal sensed by amplifier 54. The feedback loop in analog-to-digital converter circuit 14 thus acts so as to maintain a zero voltage across the input of idealized perfect comparator 54.

Summarizing the above, there are two considerations concerning offset errors which must be analyzed. During the sample mode the sample-and-hold circuit 12 provides an output which should be exactly equal to the analog input voltage, but instead includes the effect of offset voltage source 44 and offset current source 31 which represent the imperfections in the sample-and-hold circuit. Having this voltage provided to node 42 then requires that the analog-to-digital converter circuit 14 including the output from digital control logic 58 and digital-to-analog converter 60 provide a matching voltage so as to have a digital number indicating the magnitude of the source voltage. In performing this operation, circuit 14 is mathematically modeled by the introduction of an offset voltage source $V_{os2}$ 64 and offset current source $I_{os2}$ 66 in order to represent the offset voltage and offset current inherent in the imperfect comparator amplifier 54. When the output of amplifier 54 is zero, then the output number N provided by digital control logic 58 is transmitted to a device wherein it indicates the value of the experimental input signal. Thus, the output of amplifier 54 enables digital control logic 58 to provide either a higher or lower comparison signal. When amplifier 54 has zero output, this indicates that the comparison is successful and that further change to the comparison signal is not necessary. At this time, the digital number N is read from output terminal 62.

In many situations it is desirable to have a unipolar digital-to-analog converter 60, i.e. a converter which goes from zero to the maximum voltage (0 to $V_{fs}$) permitted at node 42 while having a bipolar analog input, i.e. the input circuit 10 senses positive and negative signals. These signals may have a value of ($-V_{fs}/2$ to $+V_{fs}/2$). In order to provide for the bipolar offset circuit a current source $I_b$ 68 is added in FIG. 1. The $I_b$ current source is the bipolar offset reference and provides a half scale voltage at node 42 if $(I_b)(R_{46}) = V_{fs}/2$. In cases where there is either bipolar or unipolar conversion under logic control, it is necessary to have a bipolar offset adjustment which sets $I_b$ exactly equal to $(V_{fs}/2)(R_{46})$.

In order to examine how the prior art circuit works, it is assumed that operation is in the unipolar mode and each amplifier 32 and 54 is modeled as a perfect (i.e. zero offset error) amplifier, i.e., the mathematical model including offset voltage sources 44 and 64 and offset current sources 31 and 66 is provided as shown in FIG. 1. It is also assumed that the analog input signal is zero. For purposes of initial analysis, it is also assumed that the value of offset current sources 31 and 66 is zero.

During the sample interval, the inverting input to amplifier 32 is zero since the input circuit 10 has a zero signal. The feedback loop sets up a condition of exactly zero across the inputs of idealized amplifier 32. Because of errors in amplifier 32, mathematically modeled by offset voltage source 44, this results in a voltage of $-V_{os1}$ at node 42.

When the sample switch 36 is opened, the analog-to-digital converter circuit 14 during the hold mode sees an input voltage of $V_a = -V_{os1}$ at node 42. The digital-to-analog converter 60 now proceeds to find that value of $I_{d/a}$ which results in circuit 14 providing a zero signal at the output of idealized comparator 54. This also results in a zero signal at the input of comparator 54. In order to have zero at the input of amplifier 54, there is required a voltage of $-V_{os2}$ at node 52 so that $I_{d/a} = (V_a - (-V_{os2}))/R_{50} = (V_{os2} - V_{os1})/R_{50}$. If $I_{d/a} = 0$, then the digital output at 62 is $N = 0 \ldots 0$.

It should be noted that, by happenstance, the offset voltages of the two amplifiers may be equal. If both offset voltages were equal, then the values of voltage sources 44 and 64 would also be equal. By the above formula, if by happenstance the voltage sources are equal they cancel each other out and as a result, the circuit has the desired zero output for the zero input without any need for compensating circuitry.

By similar analysis, it can be shown that if resistors 50 and 53 of the analog-to-digital converter circuit 14 are set equal to resistors 46 and 30 of the sample-and-hold circuit 12, the errors due to the input offset current of amplifiers 32 and 54 cancel, if by happenstance, the offset currents of the two amplifiers are equal. Moreover, the errors due to the current source leakage cancel if the leakage current of current source 68 when switched off equals the output leakage current of the current source of converter 60 when all the bits are set equal to zero.

Figure 2:
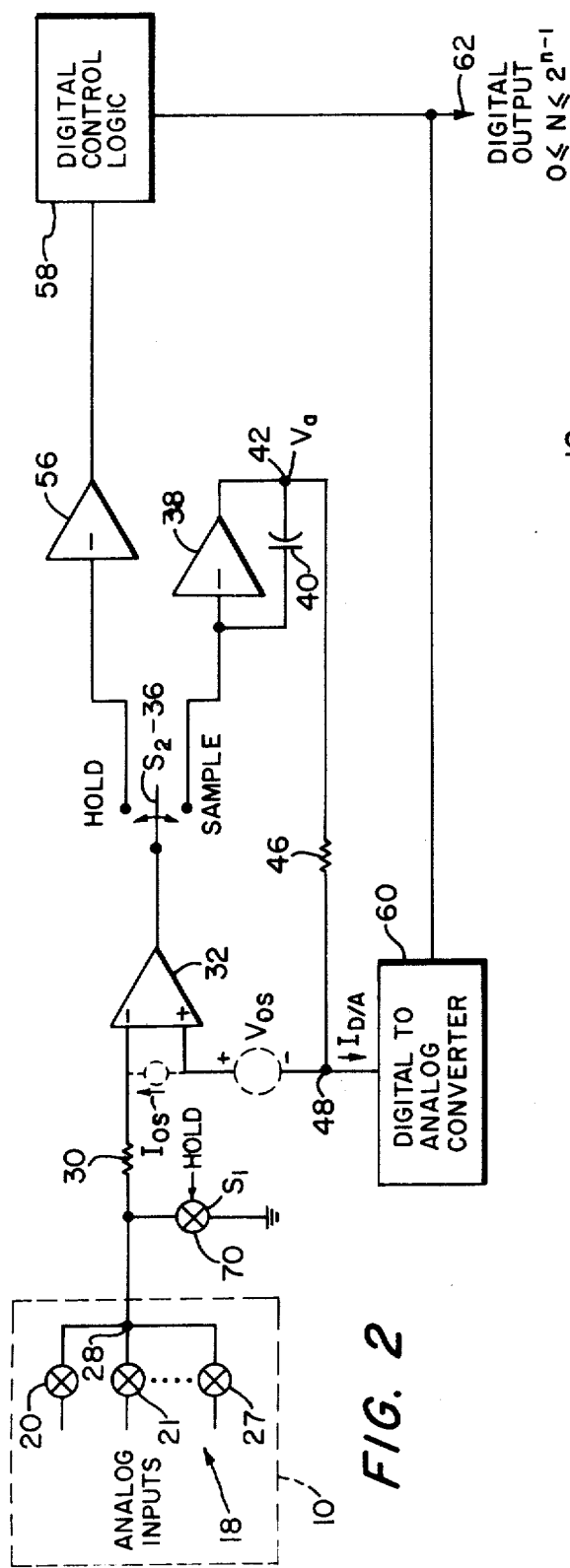
FIG. 2 is a schematic diagram of an embodiment of the apparatus of this invention.

In order to solve the problems of system offset errors and in order to make complete use of the circuitry which is necessary for providing an analog-to-digital conversion system, the circuit of FIG. 2 is provided in which the amplifiers 32 and 54 are combined, the resistors 53 and 30 are combined, the resistors 50 and 46 are combined, and only one current source is provided. As will become apparent, not only is there a reduction in the overall circuitry because of sharing the same components, but the effects of offset errors in the system are cancelled.

Referring to FIG. 2, the common circuitry shown in FIG. 1 has the same numerals. As will be readily apparent, amplifier 32 is shared by both the sample-and-hold circuit 12 and the analog-to-digital converter circuit 14. In addition, the current source output of converter 60 is used both for the analog-to-digital feedback loop and as a bipolar offset source.

In order to explain the operation in FIG. 2 an example will be considered having a unipolar input and the selected channel providing a zero signal. During the sample mode, multiplexer 18 is enabled and switch S1 70 is open. The signal sensed by the selected channel is then transferred through node 28 and resistor 30 to the negative or non-inverting input of amplifier 32. Since switch S2 is in the down position for sample-and-hold circuit 12, the feedback loop including amplifier 38, capacitor 40, node 42, and resistor 46 is operative. Under these conditions the feedback loop provides a voltage which stabilizes at node 42 with the value of $-V_{os} + (R_{30} + R_{46}) I_{os}$. This results since the errors previously mentioned have not been altered and the same components have been utilized.

At the time when the input signal is to be fixed, switch S2 is changed from the sample mode (down) to the hold mode (up). Concurrently switch S1 70 is closed and the multiplexer switch which was previously closed is opened. All the channel switches from the multiplexer are now open such that a ground reference is provided to the negative or inverting input of amplifier 32 via switch 70.

At this point, the digital control logic 58 provides signals into the digital-to-analog converter 60 in order to find the value of N which gives exactly zero across the input of amplifier 32. The voltage from capacitor 40 and amplifier 38 corresponds to the sampled voltage and provides a voltage to amplifier 32. In solving for the current $I_{d/a}$ which provides a zero comparison signal to amplifier 32 it is noted that any offset errors of amplifier 32, represented by $V_{os}$ and $I_{os}$, are present with equal values during sample mode and hold mode, and, therefore, cancel out. Moreover, all leakage currents and current differences also cancel since they are affecting the input to amplifier 32 equally during sample mode and hold mode. As a result, there are no system offset errors resulting and hence, the mathematically modeled voltage and current sources as represented in FIG. 1 are self-cancelling. Because of the cancellation features, a self-zeroing analog-to-digital conversion system has been provided.

In actuality, there are three sets of offset voltages which do not automatically cancel out and all of these differences are related to the differences between the sample and hold modes. These differences are: first, the bias current of amplifier 32 multiplied by the difference in on resistance between switch S1 70 and the switch in the multiplexer 18 which was previously enabled. The second difference is the bias difference between the hold and sample legs of switch S2 36 which is reflected back to the input through amplifier 32. As a practical matter, both of these conditions and their related temperature variations can be made so small as to have little effect upon the output results provided by the entire system.

The third difference is the sample to hold transition offset which results from the charge being transferred to/from the capacitor 38 as a result of switching from the sample circuit to the hold circuit via switch S2 36. Current state of the art circuitry limits the effect of this difference to no less than a few millivolts so that this effect must be adjusted out. Drift with temperature of this effect is so small as to have little effect on the output results provided by the entire system.

It has been found desirable in analog-to-digital conversion systems not to have a true offset of zero but to provide an offset voltage such that the transition of the least significant bit from a binary 0 to a binary 1 will be at exactly one-half of the least significant bit value above zero. This may be accomplished by adding a potentiometer adjustment to the hold circuit such that when switch S2 is in the hold position the current from this potentiometer is reflected backwards through the amplifier 32 thereby adjusting in a desired voltage which enables a transition to occur at one-half of the least significant bit value.

Another example is considered using a bipolar input. Only one current source is needed for the entire system and hence, the current source $I_b$ 68 shown in FIG. 1 has been eliminated. During the sample mode one of the channels of multiplexer 18 is enabled, switch S1 70 is off so that there is no ground being provided to the inverting input of amplifier 32, and switch S2 is in the down position, thereby allowing $V_a$ to follow the selected input voltage. For the bipolar input, the digital-to-analog converter 60 provides a current $I_{d/a}$ equal to one-half its maximum full scale current. To achieve this condition, the most significant bit provided by digital control logic 58 is set to a binary one with all the remaining bits equal to zero. As a result, the voltage at node 42 stabilizes at the voltage level of $-V_{os} + R_{30} (I_{os}) + R_{46} (I_{leakage} + I_{os}) + R_{46} (I_{fs}/2)$. Thus the current source of the digital-to-analog converter is providing a voltage across resistor 46 which is equal to one-half the maximum voltage drop able to be measured by the analog-to-digital converter circuit 14. As a result, instead of having an input range of 0 to $V_{fs}$ (full scale voltage), the voltage able to be sensed is from $-1/2V_{fs}$ to $+1/2V_{fs}$.

After having established the voltage at node 42, switch S2 is transferred to the hold position, the enabled channel from multiplexer 18 is disabled and switch S1 is closed, thereby, providing to the negative input of amplifier 32 a ground reference. At this time, the digital control logic 58 is responsive to amplifier 32 through S2 36 and buffer amplifier 56 to enable converter 60 to provide a series of comparison signals to node 48 in order to have a zero input provided to amplifier 32. The control logic 58 adjusts the input to digital-to-analog converter 60 until the comparison signal matches $V_a$. This time the digital control logic 58 provides an output number N over line 62.

As before, there is a voltage offset, i.e. $V_{os}$ and current offset, i.e. $I_{os}$, for the sample-and-hold circuit feedback loop including amplifier 32. In addition, there is a leakage current provided from converter 60. Since all these parameters had been introduced in the sample circuit, the net result is a cancellation from a system viewpoint. Moreover, by holding on the most significant bit during sample, the unipolar input has been changed to a bipolar input so that a zero analog input results in a half-scale digital code. As a result, the zero to full-scale voltage range is changed to a minus one-half full-scale to plus one-half full-scale voltage range with the digital control logic providing the enabling feature. This results in a programmable unipolar/bipolar analog-to-digital conversion system in which the feedback digital-to-analog converter 60 acts as its own switchable bipolar reference source in addition to eliminating one of the reference sources utilized in the prior art. Thus no separate bipolar reference source or adjustment has been required, thereby, simplifying the circuitry and enabling the bipolar reference to automatically track the half-scale maximum voltage without any problems of offset errors or temperature dependency.

This concept of switching on the digital-to-analog converter 60 when sampling an input signal may be extended to any input range which goes from minus the full-scale voltage to zero up to zero to plus the full-scale voltage purely under logic control. This is accomplished by a mere turning on of the proper combination of bits in the digital control logic 58 during the sample interval when sample circuit 14 is tracking the input.

The basic self-zeroing configuration shown in FIG. 2 may be readily adapted to provide other features and benefits which are not feasible with conventional analog-to-digital conversion systems. For example, the above described FIG. 2 is able to be utilized to provide a differential input without the need for an additional differential amplifier. This would be rendered possible by utilizing one channel of multichannel multiplexer 18 to provide a ground reference to amplifier 32 during hold mode, thereby eliminating the need for a switch S1 70 and its ground circuit.

In operation, during the sample mode the ground reference channel would be off such that the input signal from a selected channel of multiplexer 18 would be provided to amplifier 32. During the hold mode, the reference channel is enabled and the previous channel is disabled, thereby providing a grounded input into amplifier 32. Thus the analog value converted is actually the difference between the selected channel input signal and the ground voltage seen by the reference channel.

This concept can be further enhanced by selecting any one of the multichannels of multiplexer 18 and subsequently enabling any other channel purely under logic control and measuring the difference between the two channels. For example, if channel 20 is initially selected during the sample mode it provides an input signal to node 42. During the hold mode channel 20 is opened and channel 21 is closed, thereby providing a differential calculation of the difference between the voltage provided to channel 20 and the voltage provided to channel 21. Stated in broad terms, any one of the eight multichannel inputs may then be compared vis-a-vis any other channel input as long as only one is on during the sample interval and another is on during the hold interval. Consequently, under program control, the system may be configured as either seven single channels with respect to one return, i.e. return channel or switch 27, or any other combination of channels with respect to returns.

Because of the time interval inherent in the conversion by the analog-to-digital converter 14 and because of the sampling of the input voltages, this configuration is only practical when low frequency inputs are provided. At high frequencies, there would be dynamic mismatch which would result in poor common mode rejection.

Figure 3:
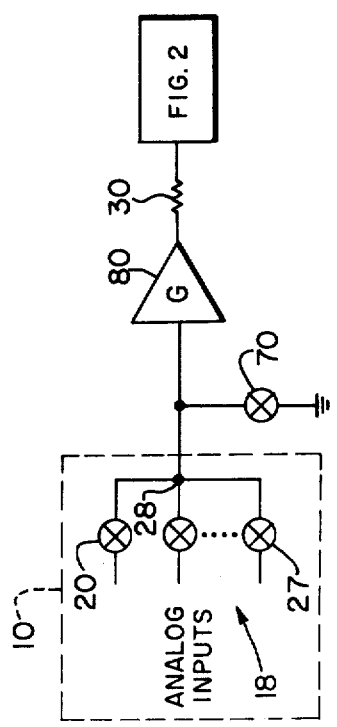
FIG. 3 is a schematic diagram of an enhanced embodiment of the apparatus of the present invention.

The second important feature able to be realized from this configuration is shown in FIG. 3 in which a gain amplifier 80 is introduced into the circuit before the amplifier 32, the gain amplifier enabling the initial signal level to be significantly increased while not affecting the system offset error whatsoever. This is accomplished since the offset error for the sample-and-hold circuit 12, which now includes gain amplifier 80, follows the ground reference switch, which in this particular instance is switch 70. Stated differently, since the sample-and-hold circuit 12 also includes gain amplifier 80, the offset error of gain amplifier 80 is cancelled along with the sample-and-hold circuit offset errors.

Thus, the self-zeroing feature of the instant circuit automatically cancels out the offset errors and drift of the gain amplifier 80 as well as that of the amplifier 32 thus enabling a low level input to be significantly increased without the problems of amplifier offset and drift voltages being introduced. This is rendered possible even with inexpensive preamplifiers because of the cancellation feature cited previously.

Figure 4:
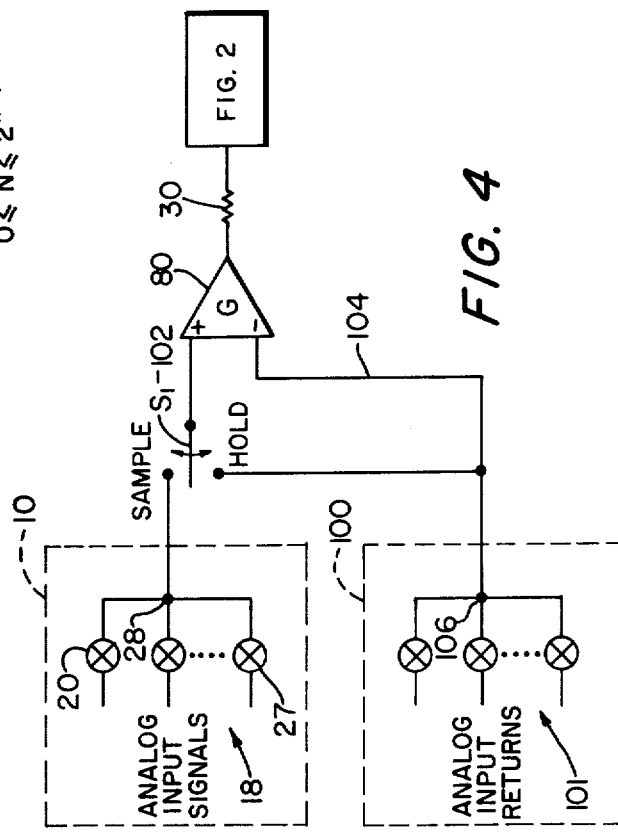
FIG. 4 is a schematic diagram illustrating a further enhancement of the input signal return circuitry of the instant invention.

A further embodiment of the invention and another use of gain amplifier 80 is shown in FIG. 4 in which the gain amplifier 80 has a differential input. In addition, instead of having one multichannel multiplexer there are two multichannel multiplexers, one providing for the analog input signal and the other providing for the input return. The embodiment shown in FIG. 4 operates as follows.

One of the channels of multiplexer 18 is utilized for the noninverting input (signal). One of the channels of multiplexer 101 is utilized for the inverting input (return). In this configuration, one channel from each multiplexer is always enabled with switch 102 in the up position during the sample mode and in the down position during the hold mode.

In operation during the sample mode, the selected channel's input signal from the multiplexer 18 is connected to the noninverting input of the gain preamplifier 80. The selected channel's input return is connected to the inverting input of gain preamplifier 80, through a corresponding selected channel of multiplexer 101 via line 104. During the hold mode, the inputs of amplifier 80 are shorted through line 104 and switch 102.

The embodiment shown in FIG. 4 has one significant difference from the embodiments shown in FIGS. 2 and 3. This difference is that the self-zero reference is now obtained by shorting the differential input; whereas, in FIGS. 2 and 3 the self-zero reference is obtained by grounding the input. In addition, because the input return voltage from multiplexer 101 remains the same during sample mode and hold mode, the differential amplifier sees the same common mode voltage during sample mode and hold mode.

In addition to the drift problem cited above, an analog-to-digital conversion system has variations introduced by common mode errors and noise. The common mode errors relate to the change in the input offset voltage versus the common mode return voltage. Since differential gain amplifier 80 sees the same common mode voltage during sample mode and hold mode, the auto-zero cancellation of input offset voltage also results in extremely small common mode errors. Using present switch technology, a common mode rejection ratio of 140 decibels is provided, comparable to the best instrumentation amplifiers. Hence, the inexpensive circuitry provided with the instant invention is able to be used at significant cost savings in analog-to-digital conversion systems requiring instrumentation performance.

Moreover, with respect to noise level at low input signal level, it is well known that drift errors are nothing more than very low frequency noise, which has been removed by the present implementation. Hence, it may be concluded that the self-zeroing analog-to-digital conversion system disclosed herein is far superior to conventional analog-to-digital conversion systems from a low-frequency noise standpoint also.

From the above disclosure, it is apparent that the apparatus of this invention provides a unique and valuable means for eliminating the system offset errors found in typical analog-to-digital conversion systems. It will also be apparent that variations of this invention can be made other than those of the preferred embodiment shown without departing from the spirit and scope of this invention. For example, if an operational amplifier is provided as amplifier 32, then the amplifier 56 may be eliminated since this buffer amplifier merely transforms current into a suitable voltage for analysis purposes. Moreover, other changes may be incorporated which remain within the spirit of this invention. Hence, it is desired to be limited only by the scope of the claims recited hereinafter.

I claim:

1. An analog-to-digital conversion system having a first state for receiving an analog input and a second state for quantifying said analog input, said system comprising:
   A. first means for providing a first voltage when said system is in said first state;
   B. second means for providing a variable second voltage when said system is in said second state;
   C. means for switching said system from said first state to said second state; and
   D. comparing means shared by said first and second means for comparing voltages, said comparing means in response to said switching means in said first state comparing said first voltage to said analog input, said comparing means in response to said switching means in said second state comparing said second voltage to a voltage resulting from the comparison in said first state, said comparing means providing for the cancellation of offset errors in said analog-to-digital conversion system, such that said system is substantially self-zeroing.

2. The system as defined in claim 1 wherein said first means in said first state includes a first and a second feedback circuit, said first feedback circuit providing for negative feedback to stabilize said second feedback circuit and said second feedback circuit providing for negative feedback to stabilize said first means in said first state.

3. The system as defined in claim 2 wherein said first feedback circuit includes a buffer amplifier and a storage holding device.

4. The system as defined in claim 3 wherein said second feedback circuit comprises said first feedback circuit and said comparing means.

5. The system as defined in claim 4 wherein said second means includes:
A. a digital-to-analog converter for providing a variable voltage, and
B. control logic for controlling the varying voltage provided by said digital-to-analog converter in response to the output from said comparing means, said control logic providing a digital number corresponding to the varying voltage provided by said digital-to-analog converter.

6. The system as defined in claim 1 wherein said second means includes:
A. a digital-to-analog converter for providing a variable current source,
B. control logic for controlling the current provided by said digital-to-analog converter in response to said comparing means, said control logic providing a digital number corresponding to the current provided by said digital-to-analog converter, and
C. current to voltage conversion means for providing said second voltage in response to said current source.

7. The system as defined in claim 6 wherein said control logic in response to a predetermined value from said comparing means in said second state provides said digital number.

8. The system as defined in claim 7 wherein said predetermined value is zero.

9. The system as defined in claim 1 wherein said comparing means is a differential amplifier.

10. The system as defined in claim 5 wherein said digital-to-analog converter is coupled to said comparing means and enabled to provide any value for the varying voltage from zero to maximum in said first state, said digital-to-analog converter changing said input range to any voltage range between minus full-scale to zero and zero to plus full-scale of its varying voltage.

11. The system as defined in claim 5 wherein said digital-to-analog converter is coupled to said comparing means and enabled to one-half maximum value in said first state, said digital-to-analog converter changing said system from a unipolar input range to a bipolar input range.

12. The system as defined in claim 5 wherein said control logic implements a successive approximation analog-to-digital conversion.

13. An analog-to-digital conversion system for converting analog inputs into coded digital numbers, said system comprising:
A. means for selecting one of a plurality of said analog inputs;
B. a sample and hold circuit for storing an input analog voltage;
C. a conversion circuit for quantifying said analog voltage into a digital number;
D. comparing means shared by said sample and hold circuit and said conversion circuit for comparing voltages; and
E. switching means for switching said system, said switching means when in a first position enabling said comparing means to compare a voltage from said analog input to a voltage from said sample and hold circuit, said switching means when in a second position enabling said comparing means to compare a voltage from said conversion circuit to a voltage established by said comparing means when said switching means was in said first position; wherein the offset errors in said analog-to-digital conversion system are cancelled such that said system is substantially self-zeroing.

14. The system as defined in claim 13 and further including means coupled to said selecting means for amplifying said selected analog input, said amplifying means increasing the magnitude of said analog input.

15. A system as defined in claim 14 wherein said amplifying means is a single-ended amplifier.

16. A system as defined in claim 14 wherein said amplifying means is a differential amplifier and said selecting means includes:
A. a first multiplexer for transferring said analog input signal to said amplifying means,
B. a second multiplexer for transferring an input return to said amplifying means, and
C. switching means for connecting said second multiplexer and disabling said first multiplexer from said amplifying means, said switching means by shorting the input to said amplifying means enabling a cancellation of the common mode errors provided from said selecting means.

17. The system as defined in claim 13 wherein said first providing means includes:
A. a differential amplifier, and
B. wherein said enabling means is a solid state switch.

18. The system as defined in claim 13 wherein said sample-and-hold circuit comprises:
A. input means for providing an analog voltage,
B. feedback voltage means for providing a feedback voltage,
C. said comparing means comparing said analog voltage to said feedback voltage, and
D. means responsive to the comparing of said differential amplifier for storing a first voltage;
and wherein said conversion circuit comprises:
A. means for providing a variable second voltage,
B. said comparing means comparing said first voltage with said variable second voltage, and
C. means responsive to said comparing means for furnishing a digital number from said providing means, said furnishing means providing a final digital number when said variable second voltage equals said first voltage.

19. The system as defined in claim 18 wherein said differential amplifier is an operational amplifier.

20. The system as defined in claim 18 wherein said providing means is a voltage-output digital-to-analog converter, and wherein said digital-to-analog converter is in a feedback loop with said furnishing means.

21. The system as defined in claim 18 wherein said providing means of said variable voltage includes a current-output digital-to-analog converter for providing a variable current source and conversion means for converting said current out of said digital-to-analog converter to said variable voltage, said digital-to-analog converter being in a feedback loop with said furnishing means.

22. The system as defined in claim 20 wherein said feedback digital-to-analog converter is enabled to provide a voltage of any value between zero and its maximum value, said converter when coupled to said sample-and-hold circuit enables an offsetting reference source to be provided, said offset reference source allowing an input voltage range between minus full-scale to zero and zero to plus full-scale of its varying voltage.

23. The system as defined in claim 22 wherein said feedback digital-to-analog converter is enabled to one-half its maximum value and coupled to said sample-and-hold circuit such that a bipolar reference source is provided.

24. An analog-to-digital conversion system comprising:
   A. means for selecting one of a plurality of analog inputs,
   B. a first differential amplifier having a first and second input and providing an output corresponding to the difference between said first and second inputs, said first differential amplifier having said first input coupled to said selecting means for receiving said analog input,
   C. means coupled to the output of said first differential amplifier for storing a first voltage, said storing means coupled to the second input of said first differential amplifier in a feedback relationship such that said first voltage tracks said selected analog input,
   D. a digital-to-analog converter coupled to said second input of said first differential amplifier,
   E. logic means for selectively controlling the output of said digital-to-analog converter,
   F. first means for switching the output of said first differential amplifier from said storing means to said logic means and said first input from said selected analog input to a ground reference,
   G. said logic means in response to said first differential amplifier through said first switching means controlling said digital-to-analog converter and said second input into said first differential amplifier, said logic means when said first differential amplifier reaches a predetermined output providing a digital number corresponding to said analog input.

25. The system as defined in claim 24 wherein said digital-to-analog converter is enabled to half maximum when said first switching means is coupling said output of said first differential amplifier to said storing means.

26. The system as defined in claim 24 and further including:
   A. a single-ended amplifier coupled between said selecting means and said first differential amplifier, said single-ended amplifier increasing the magnitude of said analog inputs.

27. The system as defined in claim 24 wherein said selecting means includes a first and second multiplexer, said system further including:
   A. a second differential amplifier having a first and second input and providing an output corresponding to the difference between said first and second inputs, said second differential amplifier having said first input coupled to said first multiplexer for receiving an analog input, said input coupled to said second multiplexer for providing an analog input return, and said output of said second differential amplifier coupled to said first differential amplifier, said second differential amplifier increasing the magnitude of said analog input.

28. The system as defined in claim 27 and further including:
   A. second means for switching said first input of said second differential amplifier from said first multiplexer to said second multiplexer, said second switching means cancelling the common errors introduced by said second differential amplifier;

29. The system as defined in claim 24 wherein said selecting means is a multichannel multiplexer, said first input being changed between any two channels of said multiplexer such that said multiplexer provides a pseudo-differential amplifier system.

30. The system as defined in claim 29 wherein one of said channels provides a zero reference voltage, said one channel being used as a return input vis-a-vis the other channels of said multiplexer.

* * * * *